US00RE39059E

(19) United States
(12) Reissued Patent
Foster

(10) Patent Number: US RE39,059 E
(45) Date of Reissued Patent: Apr. 4, 2006

(54) COMPUTER PROGRAMMABLE REMOTE CONTROL

(75) Inventor: William J. Foster, Newport Beach, CA (US)

(73) Assignee: Universal Electronics Inc., Cypress, CA (US)

(21) Appl. No.: 10/403,454

(22) Filed: Mar. 31, 2003

Related U.S. Patent Documents

Reissue of:
(64) Patent No.: 6,211,870
Issued: Apr. 3, 2001
Appl. No.: 09/111,547
Filed: Jul. 7, 1998

U.S. Applications:
(60) Provisional application No. 60/051,848, filed on Jul. 7, 1997.

(51) Int. Cl.
*G09G 5/00* (2006.01)

(52) U.S. Cl. ..... 715/744; 715/827; 715/840; 715/716

(58) Field of Classification Search ..... 345/700, 345/716–722, 744–747, 762–765, 771, 810, 345/835–839, 840–841, 970, 169, 172; 348/734, 348/563, 569; 725/37–38, 59–61; 715/700, 715/771, 716–722, 744–747, 762–765, 835–839, 715/810, 827, 970, 840–841, 169, 172
See application file for complete search history.

(56) References Cited

U.S. PATENT DOCUMENTS 4,680,729 A * 7/1987 Steinhart ..... 345/173
4,746,919 A * 5/1988 Reitmeier ..... 340/825.56
4,856,081 A * 8/1989 Smith ..... 455/151.4
4,959,810 A * 9/1990 Darbee et al. ..... 398/112
5,212,553 A * 5/1993 Maruoka ..... 725/68
5,327,160 A * 7/1994 Asher ..... 345/156
5,335,276 A * 8/1994 Thompson et al. ..... 380/266
5,367,316 A * 11/1994 Ikezaki ..... 345/158
5,410,326 A * 4/1995 Goldstein ..... 348/734
5,450,079 A * 9/1995 Dunaway ..... 341/23
5,465,401 A * 11/1995 Thompson ..... 455/558
5,517,257 A * 5/1996 Dunn et al. ..... 348/734
5,537,463 A * 7/1996 Escobosa et al. ..... 379/102.01
5,675,390 A * 10/1997 Schindler et al. ..... 715/717
5,689,663 A * 11/1997 Williams ..... 715/721
5,721,850 A * 2/1998 Farry et al. ..... 345/700
5,774,063 A * 6/1998 Berry et al. ..... 340/825.69
5,886,697 A * 3/1999 Naughton et al. ..... 345/473
5,889,506 A * 3/1999 Lopresti et al. ..... 345/158
5,909,183 A * 6/1999 Borgstahl et al. ..... 340/825.22
6,313,851 B1 * 11/2001 Matthews et al. ..... 345/718
6,597,374 B1 * 7/2003 Baker et al. ..... 345/717
6,690,290 B1 * 2/2004 Young et al. ..... 340/825.69
6,690,392 B1 * 2/2004 Wugoski ..... 345/744

OTHER PUBLICATIONS

"Take Control of Your Home," Home Theater Buyer's Guide, Spring 1997, pp. 40–48.*
"Home Vision™ Interactive Intelligent Home Control," Home Automation Systems Catalogue, p. 27, dated at least Feb., 1998.*
"In Control," Stereo Review, Aug. 1997, pp. 56–61.*
* cited by examiner

*Primary Examiner*—Sy D. Luu
(74) *Attorney, Agent, or Firm*—Gary R. Jarosik

(57) ABSTRACT

A portable hand-held remote control unit device is disclosed which may be utilized for selecting designated functions in a plurality of remotely controllable multimedia processing units. Multiple user selectable screen objects may be created from a general purpose computer and transferred to the remote control unit. The screen objects include screen layout and descriptions of soft keys to be displayed on a graphic display of the remote control unit, as well as commands associated with the screen object, the soft keys and programmable keys on the remote control unit. The user may select any of the loaded screen objects for controlling various multimedia processing units, for performing complex functions of commands to various multimedia processing units.

30 Claims, 10 Drawing Sheets

COMPUTER PROGRAMMABLE REMOTE CONTROL

Matter enclosed in heavy brackets [ ] appears in the original patent but forms no part of this reissue specification; matter printed in italics indicates the additions made by reissue.

RELATED APPLICATION INFORMATION

This application is a continuation-in-part of application Ser. No. 60/051,848 filed Jul. 7, 1997, now expired, entitled "Computer Programmable Remote Control System," which is incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure, as it appears in the Patent and Trademark Office patent files or records, but otherwise reserves all copyright and trade dress rights whatsoever.

BACKGROUND OF THE INVENTION

1. Field of the Invention

The present invention relates generally to remote control devices for electronics products.

2. Description of Related Art

The modern home may have a wide array of consumer electronics devices. These may include nearly any type of audio or video entertainment product, such as televisions, video cassette recorders, audio cassette recorders, audio/video receivers and preamps, cable boxes, laser disc players and camcorders.

Consumer electronics devices typically utilize hand-held remote control units to permit a user to rapidly and efficiently control selected functions from a distance. Early mechanical/ultrasonic remote control units were fairly limited and generally permitted only one or two functions to be controlled. For example, television remote control units utilizing mechanical/ultrasonic technology generally permitted a user to turn the power on to the television and to cycle through each channel in a preselected rotation. For some time, remote control units have been available which transmit control signals by way of infrared or radio frequency transmitters. These wireless remote control units have freed the user to move about a room or even about their home and to control the device from wherever it is most convenient to the user.

Consumer electronics devices and systems have become very complex and loaded with functionality. Particularly, with the expanding use of microprocessor-based devices and the ability to interconnect audio systems, video systems, security system, home automation systems and personal computers, the possible ways to interconnect and operate device has grown significantly. Remote control units have correspondingly become highly complex. A number of manufacturers sell remote control units which include as many as one hundred small buttons or keys, resulting in a severe decrease in the usability of these devices. This is remarkable, considering the huge number of consumers who cannot set the time on their VCR. Furthermore, the number and complexity of remote control units typically found in a home have reached a level where the convenience provided by the remote control units is often overcome by the difficulty in locating and operating them.

Thus, several problems have arisen. First, there is the problem of how to allow the user to control a huge number of features from a remote control unit. Second, there is the problem of how to avoid overwhelming the user with controls on a remote control unit which the user will never use. Third, there is the problem of users having to deal with multiple remote control units with overlapping operability. Fourth, there is the problem of the considerable amount of space which an aggregation of remote control units often occupy.

One solution which has found some acceptance in the market is the universal remote control unit. A universal remote control unit consolidates multiple remote control units and, it is hoped, improves their usability. Typical universal remote control units can learn the commands of other Remote control units, either through pre-programmed lists of consumer electronics devices or by teaching the universal remote control unit each command which the user might wish to have available on the universal Remote control unit. One of the problems with universal remote control units has been that their generic keypads are often cumbersome and not particularly intuitive in layout or labeling. Furthermore, the designers of these devices must compromise between having separate buttons for each possible command and small button sizes.

With the advent of home theater systems, the complexity of controls has advanced to an even greater plateau. Now, the remote must not only control the TV, the VCR, the cable box and the stereo, it must be able to control the surround sound quality, turn on multiple devices at the same time, and issue a series of commands to multiple devices to accomplish a single task. Naturally, the consumer electronics industry has developed products to serve this new need in the marketplace. These more advanced universal remote control units are exemplified by the Home Producer 8 from Universal Electronics, Inc. (Tustin, Calif.), the RC 2000 from Marantz (Roselle, Ill.), the RR990 from Rotel (North Reading, Mass.), and the RC-R0905 from Kenwood.

There has also been an increasing desire to integrate consumer electronics with security systems and to provide some control from a remote control unit of the home environment. For example, it is desirable that, when a user wishes to watch a cable program, not only is the TV set powered on and set to receive the video input, the A/V receiver is powered on and set to play the cable program at a reasonable loudness, the cable decoder is powered on and set to a favorite channel, but also the room's lighting is dimmed, the air conditioner is set to a comfortable level and the home security system is armed against perimeter violations. Some products (not necessarily Remote control units) are available which can be programmed to do these kinds of things. These products include the HAS-1350 Home Vision Intelligent Home Controller available from Home Automation Systems, Inc. (Irvine, Calif.), the ISR TronArch Intelligent Home Automation System, the BrightTouch from Crestron, the TheaterLink from Vantage, and the Landmark System from PHAST, the IntelliControl from Niles, and the 700T from Lexicon.

One of the common problems with universal remote control units, and a problem which is especially severe with the most flexible and programmable remote control units, is programming. A universal remote control unit simply cannot be factory-programmed with every possible configuration. The user is left with poor choices—do without some functions, spend many hours programming and reprogramming their programmable remote control unit, suffer through a remote control unit which is not programmed in a memorable manner, or paying a professional to program the remote control unit. Despite the availability of programmable remote control units, the best remote control unit for a multimedia processing unit is usually the one which is provided with a multimedia processing unit. It is very difficult to overcome this one-to-one correspondence of remote control units and multimedia processing units. These problems have resulted in the marketplace largely rejecting the more advanced universal remote control units.

SUMMARY OF THE INVENTION

The previously described problems are solved in a remote control unit which has the ability to control nearly any device controllable from a remote, yet is easily programmed. These benefits are obtained from a remote control unit which is programmable from a PC using an advanced, object-oriented user interface. The remote control unit's programming is easily modified from the PC. The user may quickly and easily build a full range of capabilities into the remote control unit, including the issuance of multiple commands with a single key press. Furthermore, because the remote control unit has a large memory, the user may focus on functionality, rather than the efficiency or compactness of the programs.

The present invention, together with additional features and advantages thereof, may best be understood by reference to the following description taken in connection with the accompanying illustrative drawings.

DESCRIPTION OF THE DRAWINGS

Further objects of this invention, together with additional features contributing thereto and advantages accruing therefrom, will be apparent from the following description of a preferred embodiment of the present invention which is shown in the accompanying drawings with like reference numerals indicating corresponding parts throughout and which is to be read in conjunction with the following drawings, wherein.

These and additional embodiments of the invention may now be better understood by turning to the following detailed description wherein an illustrated embodiment is described.

DETAILED DESCRIPTION OF THE INVENTION

Throughout this description, the preferred embodiment and examples shown should be considered as exemplars, rather than limitations on the apparatus and methods of the present invention.

The Components of the System

Figure 1:
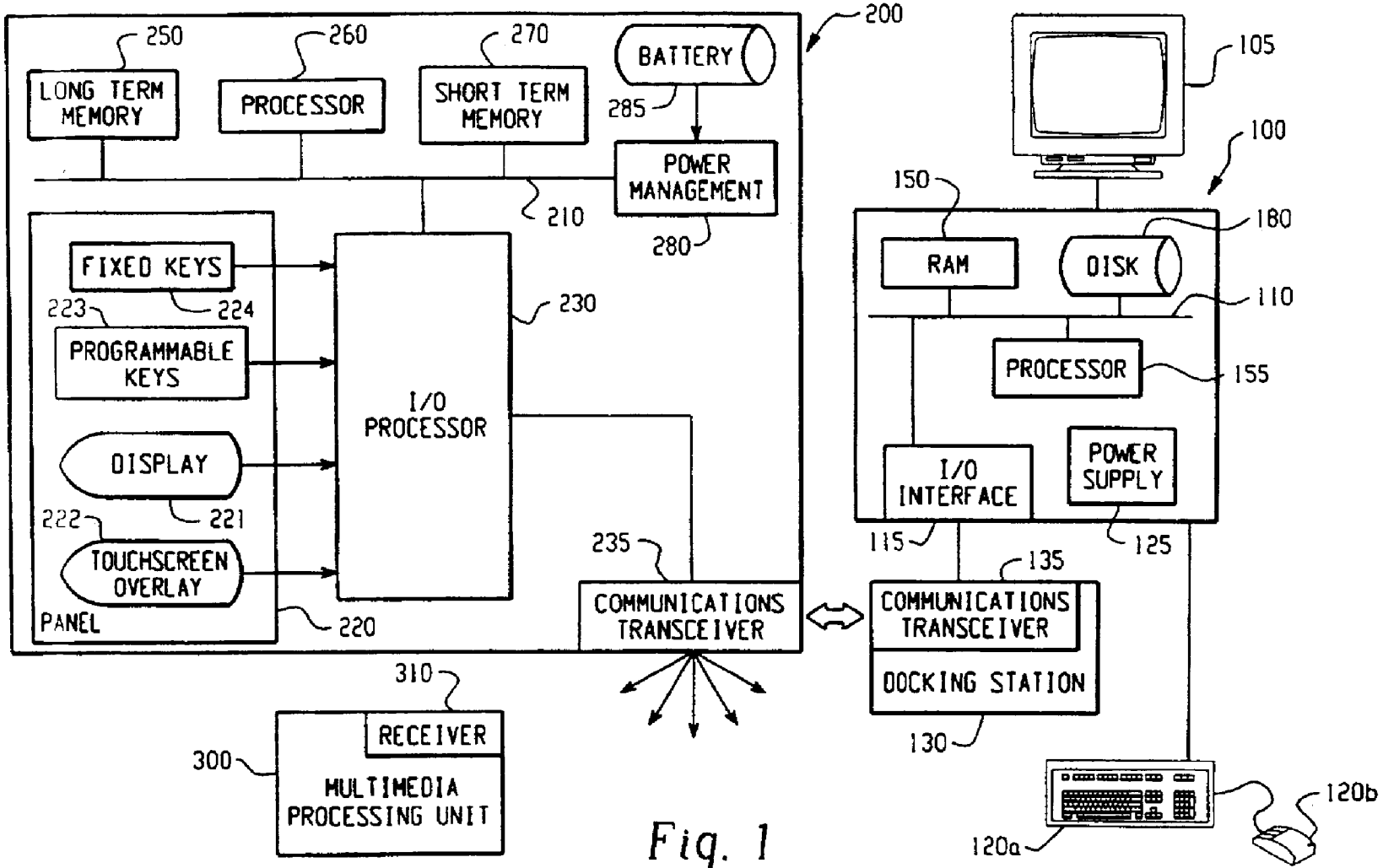
FIG. 1 is a block diagram showing a PC, a programmable remote control in accordance with the invention and multimedia processing units.

Referring now to FIG. 1, there is shown a block diagram of a general purpose computer 100, a programmable remote control unit 200, a docking station 130 and a multimedia processing unit 300. By "multimedia processing unit" it is meant a device which provides some functionality which an end user can recognize and appreciate. Most TVs, VCRs, stereo receivers, CD players, laser disk players and cable decoders are self-contained multimedia processing units. Many security systems and home automation systems are dispersed multimedia processing units. By "remote control unit" it is meant a hand-held, portable device which can be used by a user to issue commands to a multimedia processing unit which the multimedia processing unit will recognize and result in a predetermined change of performance by the multimedia processing unit. By "programmed remote control unit" it is meant a remote control unit which has a fixed set of commands which it can issue and which commands are permanently assigned to specific keys on the remote control unit. Most multimedia processing units are provided with a programmed remote control unit which is programmed with all of the commands the multimedia processing unit's engineers believed desirable. By "programmable remote control unit" it is meant a remote control unit which can be programmed with the commands needed to control an multimedia processing unit. By "command" it is meant a message which can be recognized by a multimedia processing unit as an instruction to change a particular setting of the multimedia processing unit.

The multimedia processing unit 300 includes a receiver 310 through which the multimedia processing unit may receive commands.

The general purpose computer 100 includes a processor 155 which preferably from Intel Corporation (San Jose, Calif.) and runs a Microsoft Corporation (Redmond, Wash.) Windows operating system. In conjunction with the processor 155, the general purpose computer 100 has a short term memory 150 (preferably RAM) and a long term memory 180 (preferably a hard disk) as known in the art. The general purpose computer 100 further includes a graphics display 105, a user input device preferably comprising a keyboard 120a and mouse 120b, an IO interface 115, a power supply 125 and a bus 110 as known in the art. From the user's perspective, the docking station 130 once connected to the general purpose computer 100 is a component of the general purpose computer 100.

The programmable remote control unit 200 includes a processor 260 and preferably runs Microsoft Corporation's (Redmond, Wash.) Windows CE operating system. In conjunction with the processor 260, the programmable remote control unit 200 has a short term memory 270 and a long term memory 250 as known in the art. The processor 260 is preferably a microprocessor, but may be an ASIC, logic processor or other type of processor which can operate in accordance with a program. The long term memory 250 is preferably comprised of EEPROM, but may also be a magnetic disk drive, an optical disk drive, and MO disk drive, NVRAM, SRAM, chemical storage device or other type of rewritable, non-volatile memory. The short term memory 270 is preferably a RAM. The programmable remote control unit 200 further includes a bus 210, an I/O processor 230, a power management unit 280 and a battery 285, all as known in the art.

For interfacing with a user, the programmable remote control unit 200 further includes a panel 220. The panel 220 comprises various user input devices 222, 223, 224 and a graphic display 221. The graphic display 221 may be an LCD panel, an LED panel, a holographic projection, a cathode ray tube or other compact display device which can display graphics. The user input devices preferably include fixed keys 224, programmable keys 223 and a touch screen overlay 222.

Figure 2B:
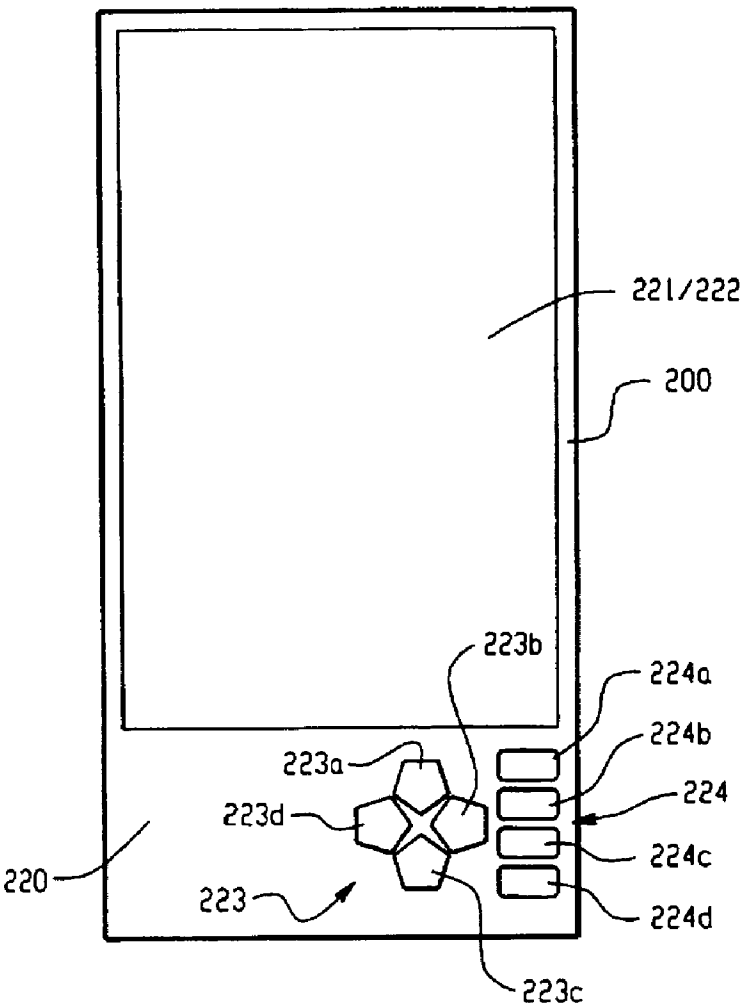
FIG. 2B is a frontal plan view of a programmable remote control unit in accordance with the invention.

The programmable keys 223 and fixed keys 224 may be comprised of buttons—mechanical, electromechanical or solid state. As shown in FIG. 2B, there are preferably four programmable keys 223a, 223b, 223c, 223d disposed in a cross-like shape. Though programmable, the programmable keys 223 preferably are programmed with consistent functions, namely, that key 223a is for increasing speaker volume, key 223b is for changing channels in an upward direction, key 223c is for decreasing speaker volume, and key 223d is for changing channels in a downward direction. As explained further below, programs for controlling multimedia processing units preferably include these assignments.

The fixed keys 224 have functions which cannot be changed. The fixed keys 224 preferably include a key 224a for toggling a back light on the display 221, keys 224b, 224c for scrolling to the next and previous screen, and a power key 224d.

The touch screen overlay 222, in conjunction with the graphic display 221, allows the programmable remote control unit 200 to be programmed with soft keys.

For interfacing with the multimedia processing unit 300 and the general purpose computer 100, the programmable remote control unit 200 includes a communications transceiver 235. The communications transceiver 235 may be electro mechanical, but is preferably wireless and conforms to the IrDA specification and consumer IR standards, and also includes an infrared transceiver and an RF transceiver which permit the programmable remote control unit 200 to control a wide range of multimedia processing units. Alternatively, the functions of communicating with the general purpose computer 100 and the multimedia precessing unit may be embodied as separate units.

Figure 8:
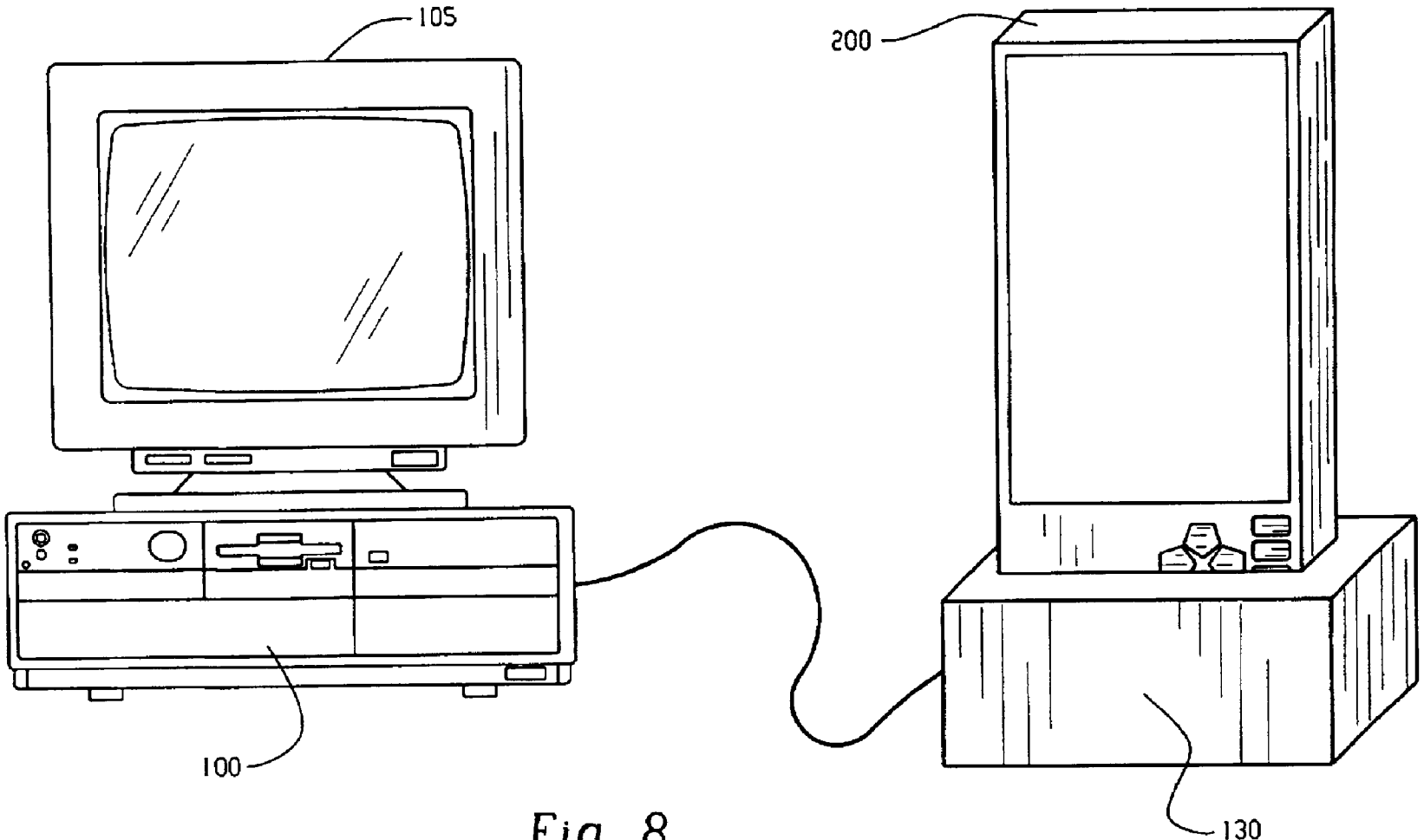
FIG. 8 is a partial perspective view of a docked programmable remote control unit in accordance with the invention.

The docking station 130 preferably comprises a cup-like unit into which the programmable remote control unit 200 may be inserted and which has a shape adapted to receive and firmly hold the programmable remote control unit 200. FIG. 8 shows the programmable remote control unit 200 inserted into the docking station 130. When the programmable remote control unit 200 is inserted into the docking station 130, the programmable remote control unit's communications transceiver 235 is in registration with a corresponding communications transceiver 135 in the docking station 130. The docking station 130 is coupleable to the I/O interface 115 of the general purpose computer 100, preferably in conformance with an interface standard which is common, bidirectional and inexpensive, such as serial or USB.

As an alternative to the docking station 350, the communications transceiver 235 of the programmable remote control unit 200 may include a USB port or similar means which can be connected directly to a USB port in the general purpose computer 100.

The communications transceiver 135 of the docking station preferably includes an infrared receiver and an RF receiver which permit the docking station 130 to recognize the commands which are recognized by a wide range of multimedia processing units.

The Method of the Invention

Methods of the invention includes a learning phase, a development phase, a transfer phase and a use phase. The description of these phases is accompanied by an example of how the commands issued from a prior art programmed remote control unit 200A shown in FIG. 2A maybe programmed and used by the programmable remote control unit 200 of FIG. 2B.

The exemplary programmed remote control unit 200A is of a common variety for controlling a television, which is the multimedia processing unit of the example. Similar programmed remote control units are provided with other multimedia processing units, such as cable boxes. The programmed remote control unit 200A includes a number of keys, each resulting in a designated command as shown in Table I below. Typical TVs generate an appropriate display when a key is pressed and the TV recognizes the command. Other multimedia processing units also have similar capabilities, though this is not described further herein.

TABLE I

| Label | Reference | Command |
|---|---|---|
| mute | 220A | toggle the TV's speaker on and off |
| power | 230A | toggle power to the TV on and off |
| enter | 275A | after one or more numbers keys has been pressed, cause the TV to recognize the corresponding entered number |
| 1 | 201A | enter the number 1 |
| 2 | 202A | enter the number 2 |
| 3 | 203A | enter the number 3 |
| 4 | 204A | enter the number 4 |
| 5 | 205A | enter the number 5 |
| 6 | 206A | enter the number 6 |
| 7 | 207A | enter the number 7 |
| 8 | 208A | enter the number 8 |
| 9 | 209A | enter the number 9 |
| 0 | 210A | enter the number 0 |
| ch− | 260A | change the displayed TV station to the station next lower in a predefined order |
| ch+ | 265A | change the displayed TV station to the station next higher in the predefined order |

TABLE I-continued

| Label | Reference | Command |
|---|---|---|
| display | 250A | toggle an information display of such things as currently tuned station, volume, and the time |
| vol− | 270A | decrease the speaker volume by a predetermined amount |
| vol+ | 275A | increase the speaker volume by a predetermined amount |

In setting up the system of the invention, the user first connects the docking station 130 to the general purpose computer 100. Preferably, the docking station 130 includes a serial communications cable which may be connected to an open serial port of the I/O interface 115, or a USB cable which may be connected to an open USB port. The user then installs remote control development software on the hard drive 180. The remote control development software preferably detects the docking station 130 and determines if the docking station 130 is working correctly. Next, a configuration wizard prompts the user to insert the programmable remote control unit 200 into the docking station 130 and begin the learning phase.

Learning Phase

Figure 12:
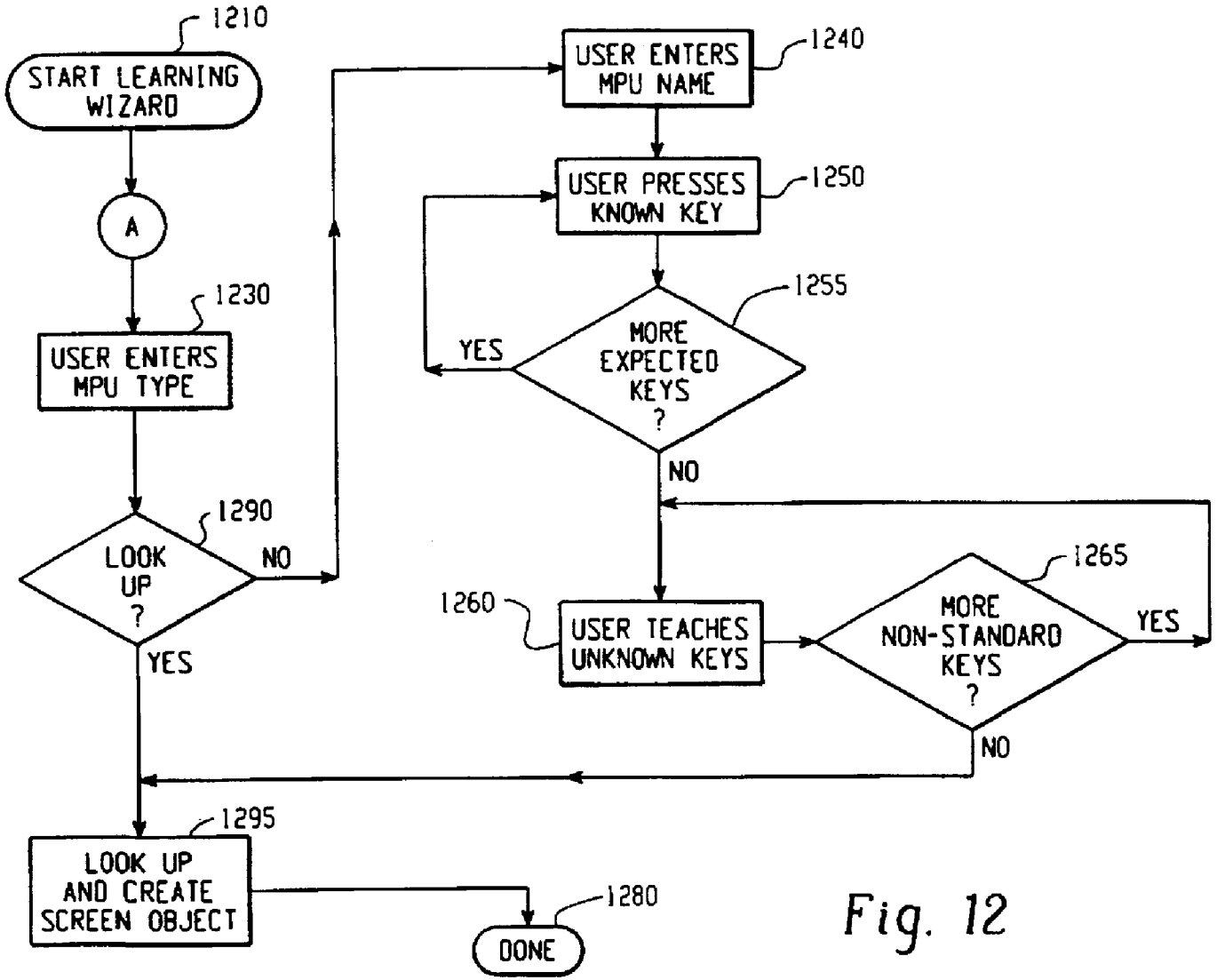
FIG. 12 is a flowchart of a method of programming a programmable remote control unit in accordance with the invention.

Referring now to FIG. 12, a method of programming the programmable remote control unit 200 is described and is accompanied with a description of an exemplary embodiment. The remote control development software preferably uses Active X objects technology.

The remote control development software provides the user with the ability to create, edit, delete and download to the programmable remote control unit 200 one or more "screen objects." A screen object comprises a screen layout definition, soft key objects and programmable key objects, altogether which provide for a single screen which occupies the display 222 and the commands associated therewith. A "soft key object" comprises a graphic or pointer to a graphic representing a soft key which will be displayed on the display 221, a text label for the graphic, a location on the display 221 for the graphic, and a tagname for command which the programmable remote control unit 200 will issue when the soft key is pressed by the user. A "programmable key object" preferably comprises an identifier of one of the programmable keys 223 and a tagname for a command which the programmable remote control unit 200 will issue when the identified programmable key 223 is pressed by the user.

The remote control development software preferably stores screen objects in a database. The remote control development software preferably is provided with a number of preconfigured screen objects, and during installation of the remote control development software, a database of the preconfigured screen objects is preferably created. Preconfigured screen objects provide a short cut to programming the programmable remote control unit 200, and may be used as templates in the development phase, discussed below. The preconfigured screen objects can come from an image table or dynamically created by software based upon functionality of the remote and its purpose. The database preferably can differentiate preconfigured screen objects from custom screen objects, and deter the user from editing them.

The publisher of the remote control development software preferably makes available new preconfigured screen objects as new multimedia processing units are put on the market to further increase the ease-of-programming of the programmable remote control unit of the invention. The preconfigured screen objects may also be obtained in the aftermarket from third parties, such as the vendors of multimedia processing units.

In the learning phase, the commands for the multimedia processing unit 300 are obtained by the remote control development software and used to prepare a screen object corresponding to the programmed remote control unit 200A of the multimedia processing unit 300. It should be appreciated, however, that the remote control development software can be used to learn commands from multipurpose, universal and programmable remote control units as well as single-purpose programmed remote control units as shown in the example.

Figure 3:
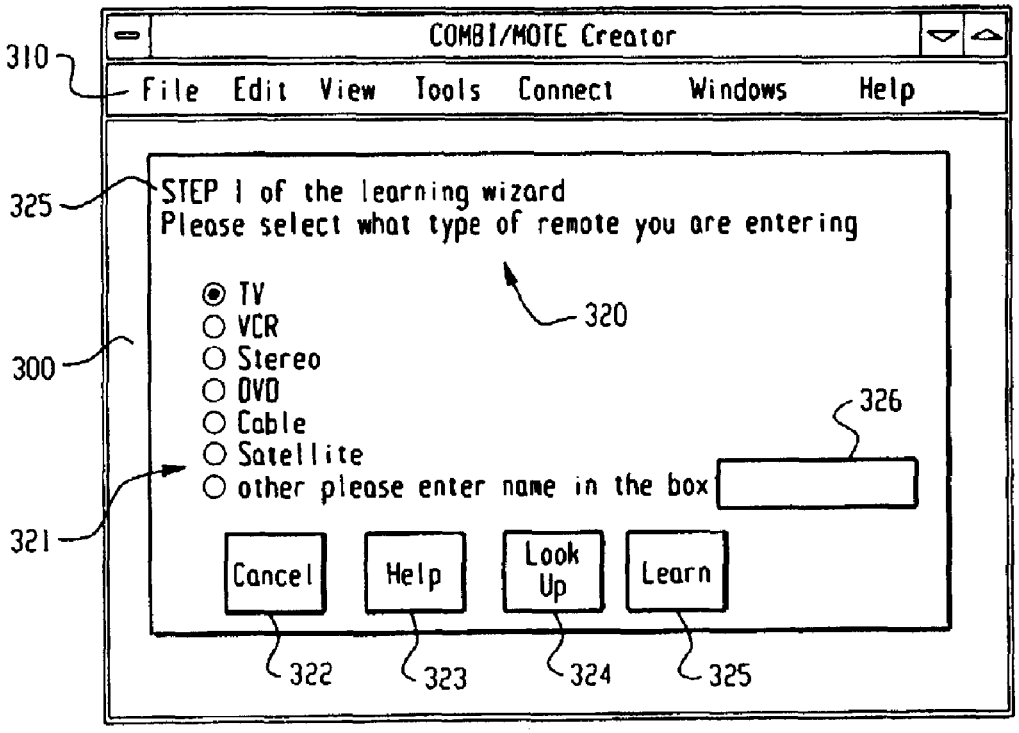
FIG. 3 is a screen shot of a selection screen of a remote control development program in accordance with the invention.

In step 1210, the user starts the remote control development software and activates the wizard for learning the commands for a multimedia processing unit. A screen 300 such as that shown in FIG. 3 is preferably displayed on the display 105 of the general purpose computer 100. This screen 300 displays the beginning point of the learning wizard. The screen 300, as well as the other screens described herein, conform to the Windows95 (or later) user interface which is well known in the art. A menu bar 310 shows several commands which a user may select.

The screen 300 includes a prominent dialog 320. The dialog 320 includes descriptive text and a list of multimedia processing unit types 325. The dialog 320 also includes a Cancel button 322 and a Help 323 which will be self-evident to those of skill in the art, as well as a Look Up button 324 and a Learn button 325. A row of radio buttons 321 is provided to permit the user to select the multimedia processing unit type, and there is preferably a free-form field 326 as well. In step 1230, the user selects one of the displayed multimedia processing unit types or enters a free-form name. As shown further below, the multimedia processing unit type selected here, or the name entered in field 326, will be used by the remote control development software as a prefix name for the screen object and for the tagnames for the commands in the screen object.

After the user has selected the multimedia processing unit type, the commands of the multimedia processing unit 300 are learned. If the user clicks on the Look Up button 324 (step 1290), the remote control development software allows the user to select the multimedia programming unit from the database of screen objects (step 1295). Accordingly, the remote control development software displays a list of preconfigured screen objects, sorted or limited according to characteristics such as multimedia processing unit type, manufacturer, and date of manufacture. The user may then select one of the preconfigured screen objects, and learning of the commands of the multimedia processing unit 300 is complete (step 1280).

Figure 4:
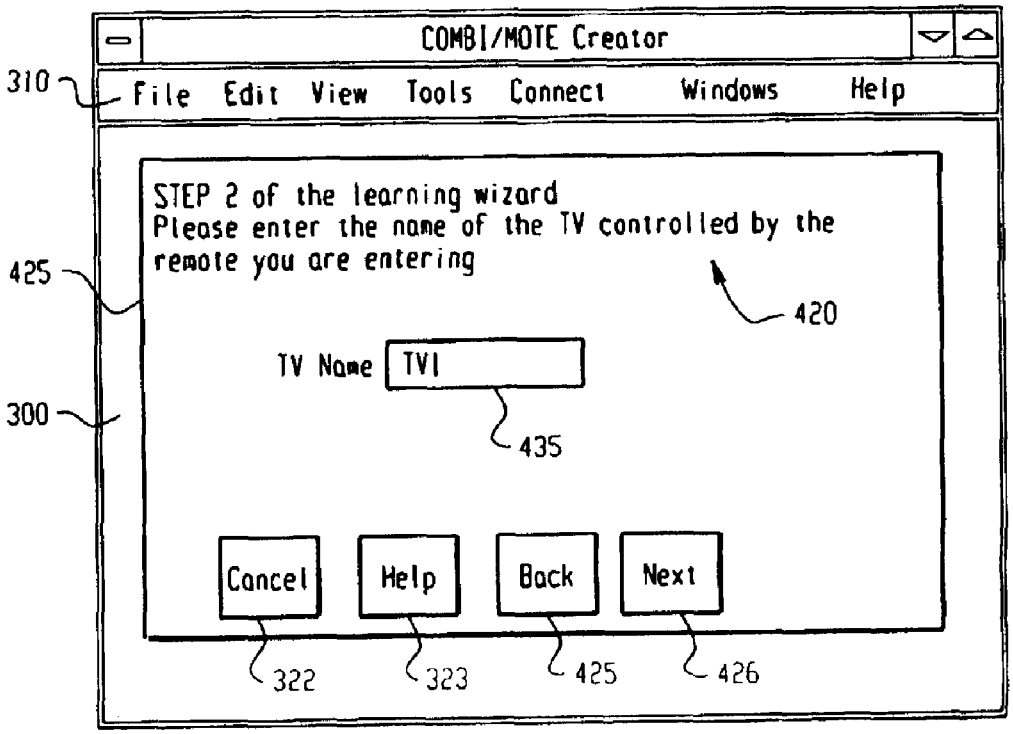
FIG. 4 is a screen shot of name entry screen of a remote control development program in accordance with the invention.

If the user clicks on the Learn button, the individual keys of the programmed remote control 200A will be learned (steps 1240–1265). In this regard for example, the remote control development software displays a dialog 420 as shown in FIG. 4. The dialog 420 includes the buttons 322, 323 as well as a Back button 424 and a Next button 425.

The user now enters the name of the multimedia processing unit 300 whose commands are to be learned (step 1240). Dialog 420 includes a prompt 425 and a data entry field 435 where the user enters the name of the multimedia processing unit 300. The remote control development software preferably provides a default name for the multimedia processing unit 300 in the field 435. This default name preferably comprises the type of multimedia processing unit selected in step 1210, plus a sequential number for each multimedia processing unit of the type learned. The remote control development software also preferably utilizes the multimedia processing unit type in the prompt 425.

Preferably, remote control development software is intelligent enough to save the user from teaching every key of the programmed remote control unit 200A. In this regard, after the user teaches the remote control development software each new key, the remote control development software attempts to correlate the learned key commands against those in the database, and to select the multimedia processing unit which appears to be that being taught.

In another convenient aspect, the remote control development software preferably includes, for each multimedia processing unit type, a list of command types which that type of multimedia processing unit normally will recognize. For example, all typical TVs recognize commands for power control, volume control, and number keys, and all typical VCRs recognize commands for play, stop, pause, rewind and fast forward. When learning keys of the programmed remote control 200A, the remote control development software preferably asks the user to teach commands of expect command types first, and then, if no match in the database has been found, then non-standard commands.

Figure 5:
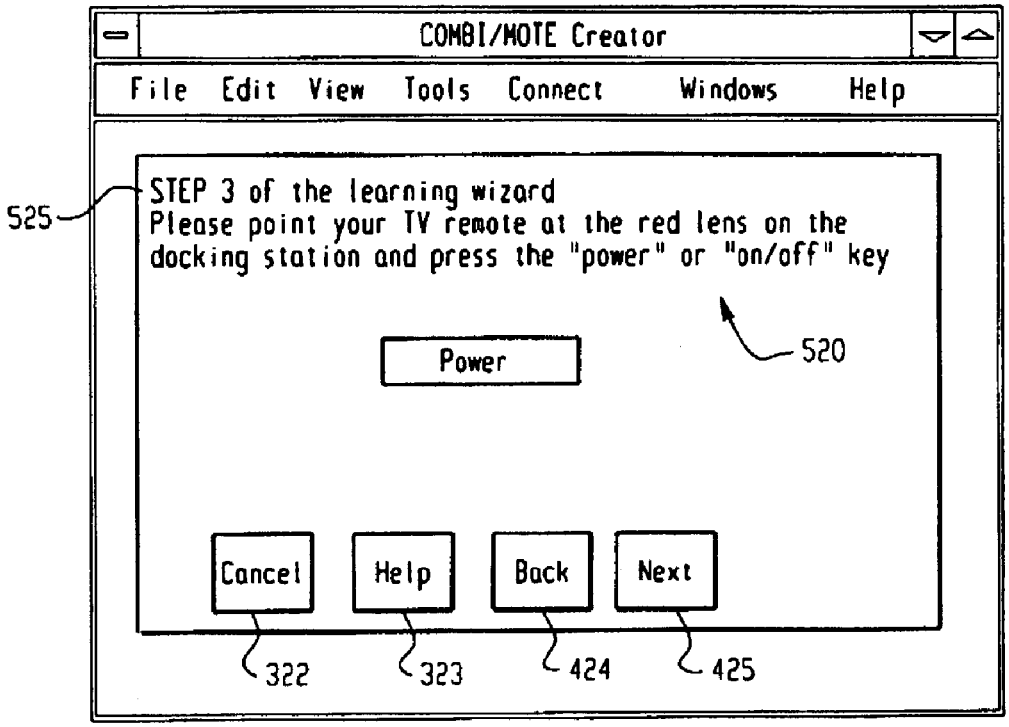
FIG. 5 is a screen shot of a command learning screen of a remote control development program in accordance with the invention.

After the user clicks on the Next button 425, a dialog 520 as shown in FIG. 5 is displayed. From this screen, the remote control development software learns a number of expected command types of the multimedia processing unit. Accordingly, the remote control development software displays a prompt 525 in the dialog 520 for the user to aim the programmed remote control unit 200A that came with the multimedia processing unit 300 at the communications transceiver 135 of the docking station 130, and to press the expected keys on the programmed remote control unit 200A. After the remote control development software recognizes each key press and records the command from the programmed remote control unit 200A (step 1250), the remote control development software displays a next expected key, until all of the expected keys have been learned (step 1255). Preferably, after the remote control development software learns each new expected command, it test the learned commands against those of the screen objects in the database. If a match is found, then the user is given the opportunity to accept the match found by the remote control development software or to continue teaching.

Figure 6:
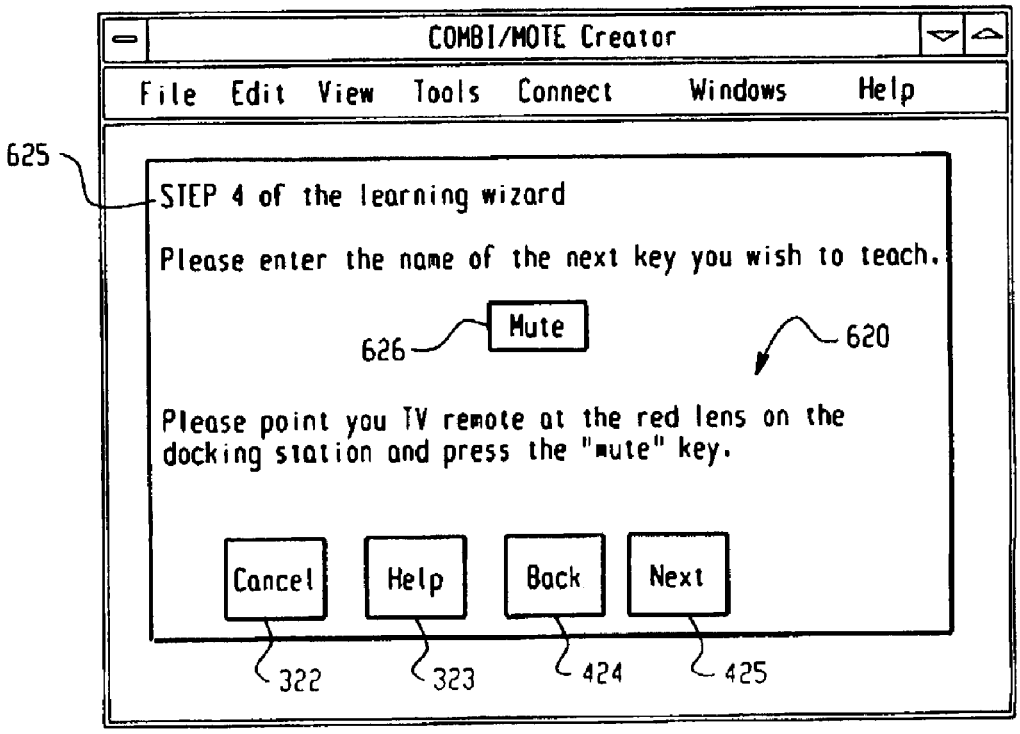
FIG. 6 is a screen shot of another command learning screen of a remote control development program in accordance with the invention.

After the user clicks on the Next button 425, a dialog 620 as shown in FIG. 6 is displayed. In this step 1260, the remote control development software learns a non-standard commands of the multimedia processing unit 300. Accordingly, the remote control development software displays a prompt 625 in the dialog 620 for the user to enter the name of the non-standard key in an entry field 626 and to aim the programmed remote control unit 200A at the transceiver 135 of the docking station 130, and to press the named key on the programmed remote control unit 200A. After the remote control development software recognizes each key press and records the command from the programmed remote control unit 200A, the remote control development software displays the same dialog 620 until all of the non-standard keys have been learned (step 1265).

Figure 7:
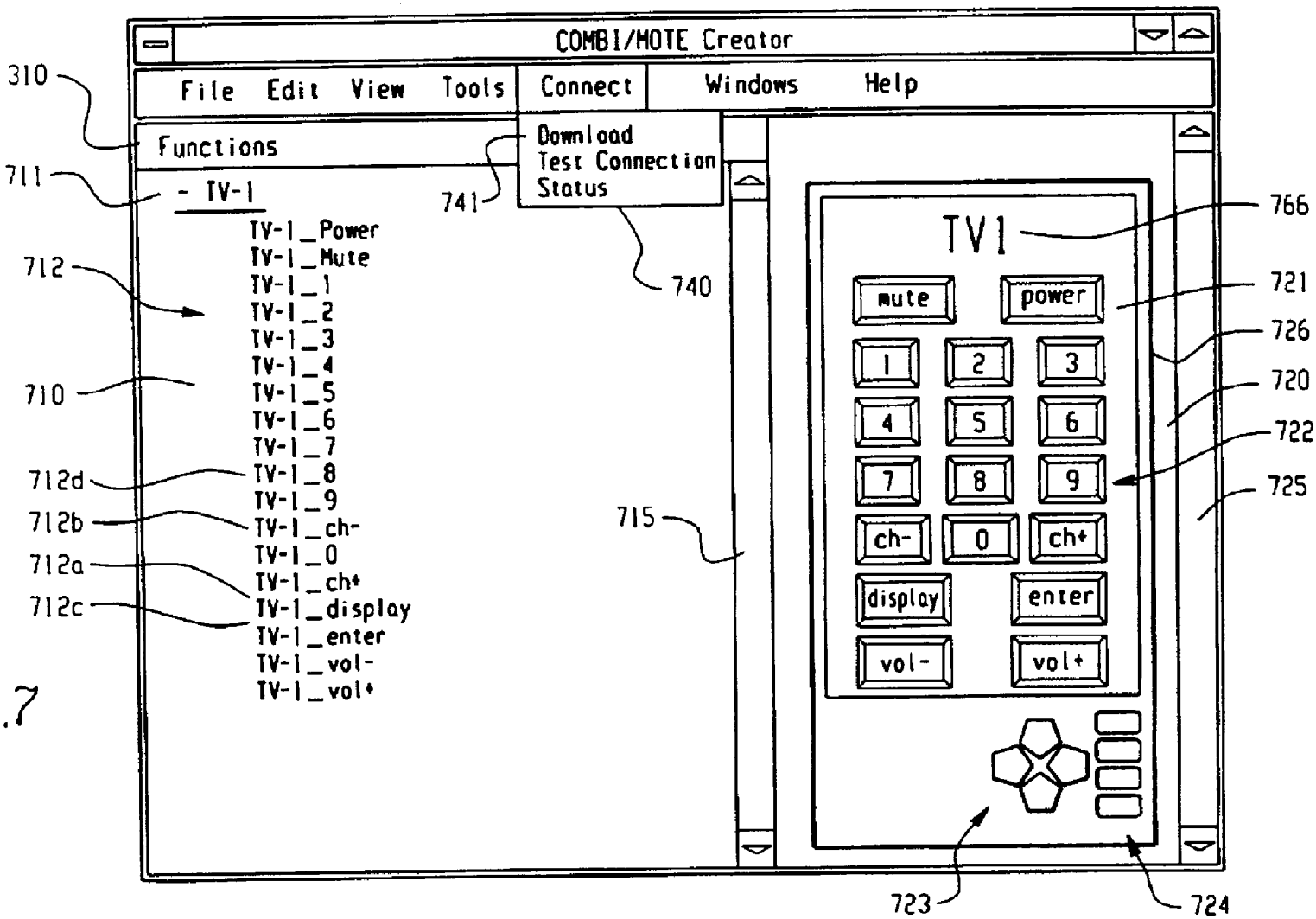
FIG. 7 is a screen shot of a screen object layout screen of a remote control development program in accordance with the invention.

If the remote control development software has identified the user's multimedia processing unit and selected the corresponding preconfigured screen object, the remote control development software preferably shows a representation of the screen object as exemplified by the screen shot of FIG. 7. FIG. 7 shows the menu bar 310 mentioned above, plus a left pane 710 and a right pane 720.

Figure 2A:
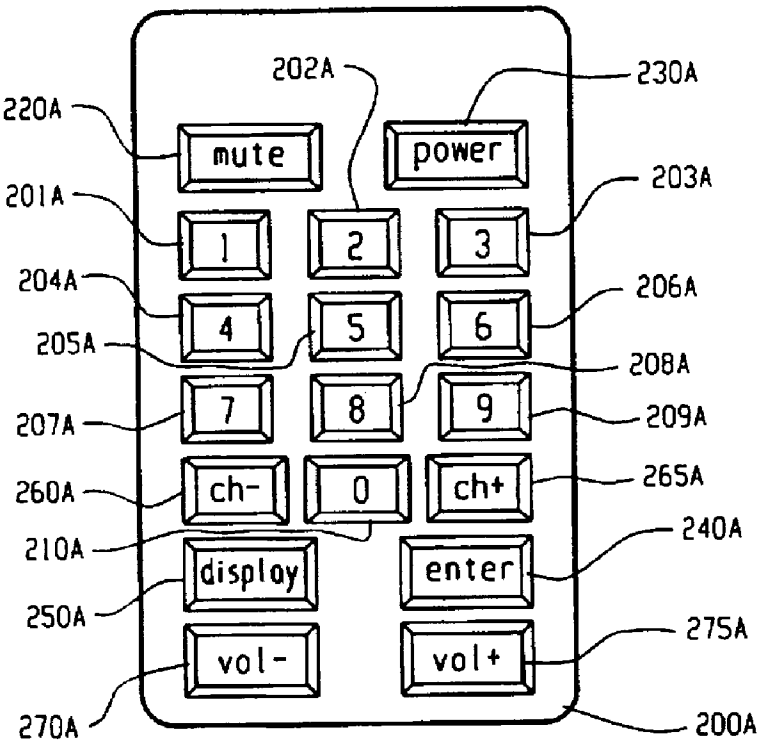
Fig. 2A PRIOR ART
FIG. 2A is a frontal plan view of a prior art programmed remote control unit.

The right pane 720 shows a representation 726 of the programmable remote control unit 200, with a representation 721 of the appearance of the screen object in the programmable remote control unit's display 221, the programmable keys 723 and the fixed keys 724. The representation 721 includes the multimedia processing unit's name 766 as entered by the user in step 1240. The representation 721 also includes soft keys 722 corresponding to the keys 201A–275A of the multimedia processing unit's programmed remote 200A (FIG. 2A). The representation 721 preferably precisely mimics the key sizes and locations of the multimedia processing unit's programmed remote control unit 200A.

The left pane 710 is a display of screen object information. The left pane 710 shows the screen object's name 711, plus a list 712 of tagnames of the commands in the screen object. Those of skill in the art will appreciate the correspondence between the tagnames 712 of commands, the soft keys 722 and commands. For preconfigured screen objects, programmable key objects for controlling speaker volume and channel rotation are preferably also mapped to the programmable keys 723/223 as discussed above. Soft key objects may include these mappings.

The left pane 710 preferably is for displaying information about all available screen objects. This display is preferably hierarchical, and a user may toggle the display of the component objects of a screen object by clicking on a '+' (to display) or '–' (to hide) to the tagnames 712. A scroll bar 715 allows the user to scroll through the list of screen objects and their respective components (if displayed).

The right pane 720 preferably is for displaying all available screen object representations. A scroll bar 725 allows the user to scroll through the screen object representations.

In the case where the user is teaching the remote control development software the commands of a multimedia processing unit for which the remote control development software lacks a preconfigured screen object, the user will need to create the screen object's layout manually. This is performed in the Development Phase. The user may also modify edit screen objects and even create new screen objects by copying layout information, soft key objects and programmable key objects from existing screen objects.

Development Phase

Figure 9:
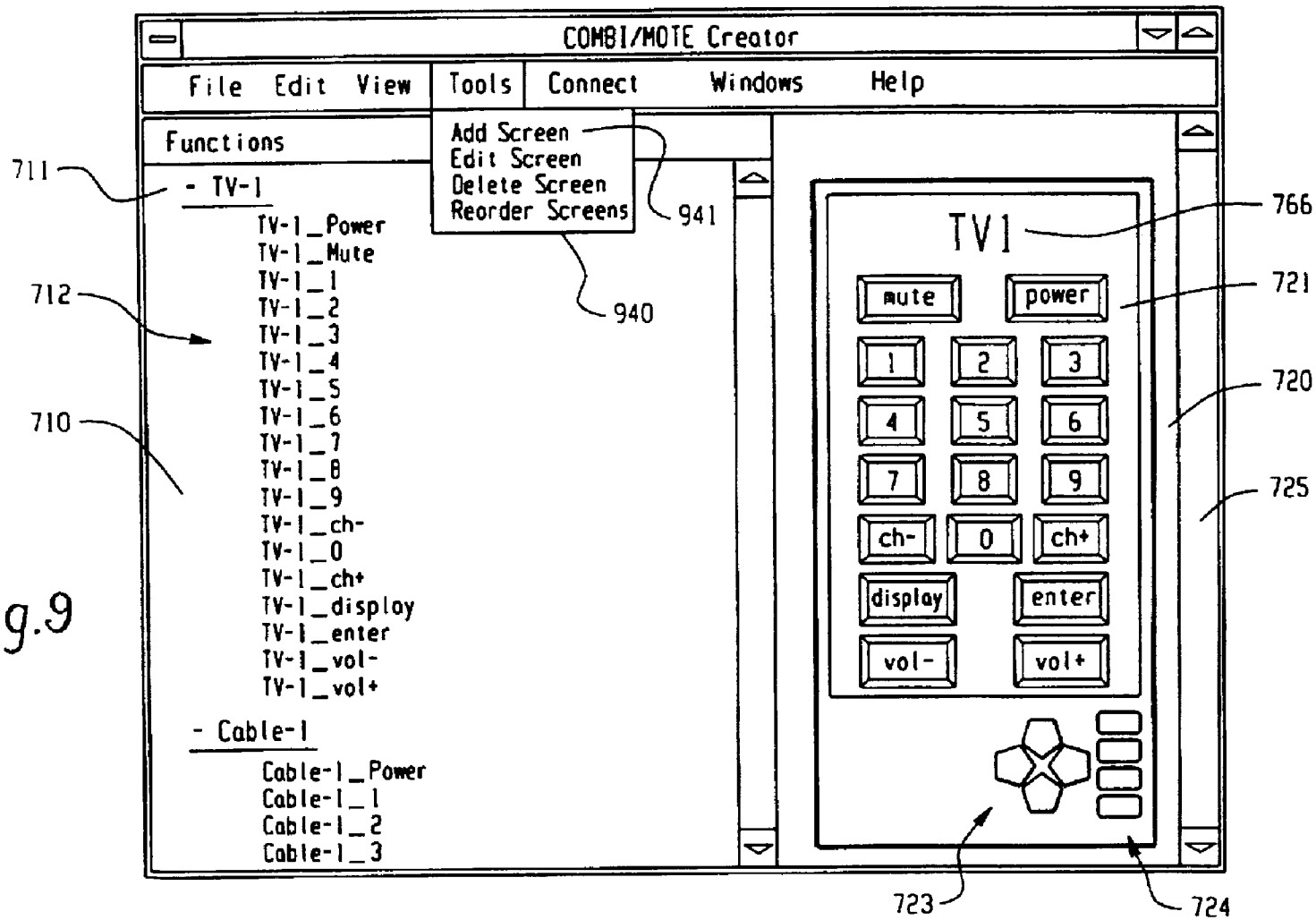
FIG. 9 is a screen shot of a screen object layout screen of a remote control development program having commands for multiple multimedia processing units in accordance with the invention.

In the development phase, a user may add, edit, delete or reorder screen objects. Each of these functions preferably may be activated by the user from a Tools menu 920 as shown in FIG. 9. There are preferably also short-cut keys or tool bar buttons for accessing this feature in the manner known in the art.

As shown in FIG. 9, the remote control development software is displaying in the left pane 710 not only the screen object information of the TV multimedia processing unit described above, but also screen object information of a cable box multimedia processing unit. Although not shown in FIG. 9, a representation of the cable box's screen object is also available in the right pane 720 and can be displayed using the scroll bar 725.

Figure 10:
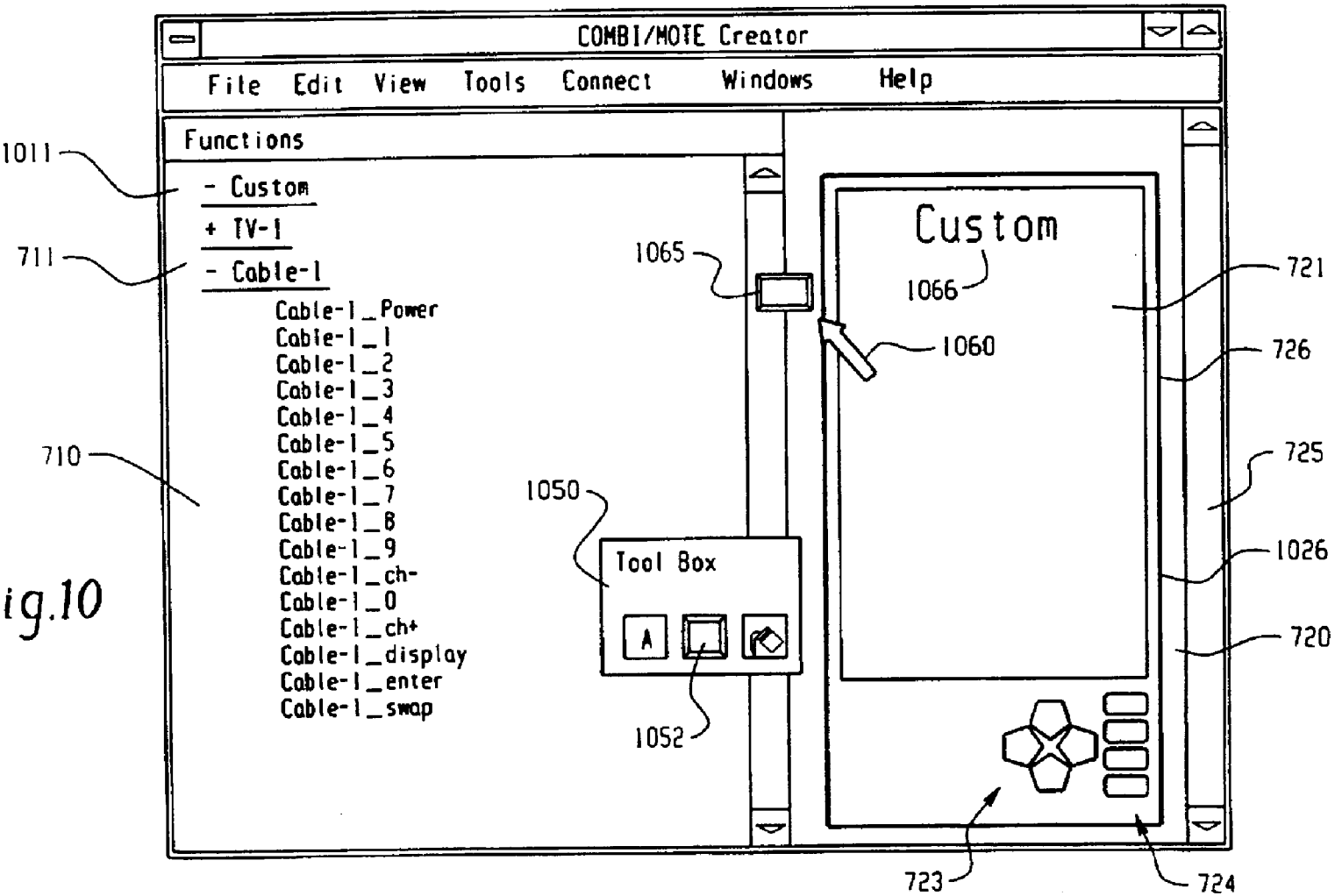
FIG. 10 is a screen shot of a custom screen object creation screen of a remote control development program in accordance with the invention.

If a new screen object is to be created, the user selects an Add Screen command 941 from the Tools menu 940. As shown in FIG. 10, the remote control development software then creates a new screen object with the title Custom 1066, and a representation 1026 of the programmable remote control unit 200 in the right pane 720 with only a title 1066.

The remote control development software preferably provides drag and drop tools for the user to create and edit the screen object, and displays a tool box 1050 having a number of object creating and editing tools for the user to use. For example, the user could create a new soft key object by dragging a button tool 1052 to the display area 721 of the representation 726 of the programmable remote control unit 200. A mouse cursor 1260 is shown in FIG. 12 dragging a graphic of a button 1265 for the soft key object. The remote control development software preferably provides other object-oriented editing controls as known in the art. These controls permit the user to modify the shape and location of soft keys, edit the commands associated with soft keys and programmable keys, change text labels, and otherwise edit the appearance of the screen object.

The soft key objects and programmable key objects preferably may include more than one command. Tagnames may be dragged from the left pane 710 and dropped onto representations of the desired object in the right pane 720. Preferably, if the user moves the mouse cursor 1060 over the representation of an object in the right pane 720, the remote control development software displays the commands associated with that representation. By double-clicking on the representation of the object, an edit window is preferably displayed so that the order of tagnames may be rearranged and sequence controls, such as if-else and for-next structures, may be inserted. Preferably, a user may assign commands to a screen object directly, so that when the screen object is selected from the programmable remote control unit 200, the commands assigned to the screen object directly are automatically issued by the programmable remote control unit 200.

Figure 11:
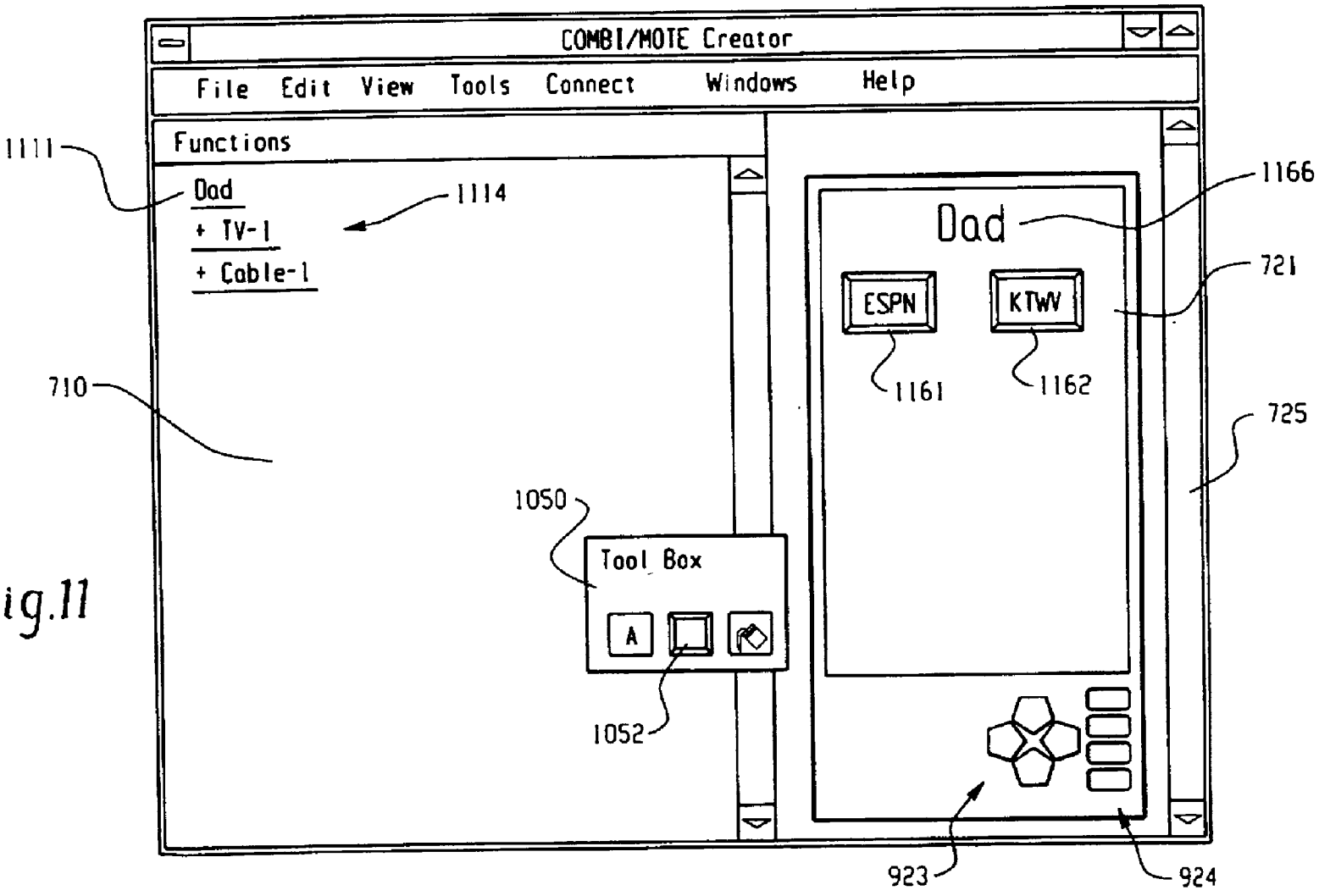
FIG. 11 is a screen shot of another custom screen object creation screen of a remote control development program in accordance with the invention.

Referring now to FIG. 11, there is shown a screen shot wherein of an exemplary custom screen object. This screen object is entitled "Dad" 1166 and was created for the father of a household. The title 1166 is shown both in the left pane 710 and in the right pane 720 as 1111. The Dad screen object has two soft key objects and corresponding soft keys 1161, 1162. The Dad screen object also has four programmable key objects in the manner previously described whose tagnames 1114 are shown in the left pane 710. Below the title 1166, there are no tagnames. This is because all of the commands of the Dad screen object are drawn from other screen objects.

This screen object demonstrates one of the significant benefits of the system and method of the invention. The soft key object 1161 has been programmed with a series of commands for turning on the TV and cable box, then tuning the TV to receive from the cable box, then tuning the cable box to Dad's favorite cable channel, ESPN. The soft key object 1162 has been programmed with a series of commands for turning on the stereo receiver, then tuning the stereo receiver to Dad's favorite radio station, KTWY.

Transfer Phase

After the user is satisfied with his screen objects, he then downloads them from the general purpose computer 100 to the programmable remote control unit 200. The first step in this process is for the user to insert the programmable remote control unit 200 into the docking station 130, as shown in FIG. 8. Once docked, software in the programmable remote control unit 200 and general purpose computer 100 logically connect the devices and test the connection.

Next, the user uses the general purpose computer 100 to select the screen objects stored in the database to be downloaded, and the user activates a download command from the general purpose computer 100. As shown by example in FIG. 7, the user selects a Download command 741 from a Connect menu 740 on the menu bar 310. The Connect menu 740 preferably also includes commands for testing the connection between the general purpose computer 100 and the programmable remote control unit 200, and for checking on the status of the connection. There are preferably also short-cut keys or tool bar buttons for accessing these features in the manner known in the art. Screen objects preferably may be downloaded individually or in groups.

Once the programmable remote control unit 200 is loaded with screen objects, the programmable remote control unit 200 may be removed from the docking station 130 and is ready for use to control the multimedia processing unit 300.

It should be appreciated that the general purpose computer 100 may be used to create and edit screen objects apart from any remote control units and without having the programmable remote control unit 200 in the docking station 130.

Use Phase

Once loaded with screen objects, the programmable remote control unit 200 is ready for use. When powered on, the programmable remote control 200 unit preferably automatically loads one of the stored screen objects. The user may scroll through loaded screen objects using the fixed keys 224b, 224c. The programmable remote control unit 200 generates displays of soft keys and other features of the screen object on the display 221, and generates the commands of the soft key objects and programmable key objects when the corresponding soft keys or programmable keys are pressed.

Although exemplary embodiments of the present invention have been shown and described, it will be apparent to those having ordinary skill in the art that a number of changes, modifications, or alterations to the invention as described herein may be made, none of which depart from the spirit of the present invention. All such changes, modifications and alterations should therefore be seen as within the scope of the present invention.

It is claimed:

1. A remote control development program comprising a set of instructions on a computer-readable medium, the instructions configured to cause a general purpose computer to provide a user with the ability to edit a first screen object;

the general purpose computer comprising a processor, an operating system, a short term memory, a long term memory, a graphics display and a user input device, the screen objects each comprising a screen layout definition and at least one key object which is a soft key object or a programmable key object, the screen object providing for a screen display and commands associated therewith, wherein each soft key object comprises a representation of a soft key, a text label for the representation, a location for displaying the [graphic] *soft key object*, and a tagname for a command which is to be issued when the soft key is pressed, each programmable key object comprises an identifier of one of plural programmable keys of a programmable remote control unit and a tagname for a command which is to be issued when the identified programmable key is pressed, each command comprises a message which, when received by a given multimedia processing unit, causes the multimedia processing unit to alter a defined setting of the multimedia processing unit in a predictable manner;

the remote control development program further comprising instructions for causing a computer to facilitate editing of the first screen object by performing the following steps:

(a) displaying a representation of the appearance of the first screen object;

(b) simultaneously displaying information regarding the first screen object and the key objects of the first screen object;

(c) providing [objected] *object* oriented tools for creating and editing soft key objects;

(d) providing [objected] *object* oriented tools for creating and editing labels;

(e) displaying tagnames for commands which may be assigned to soft key objects in the first screen object, programmable key objects in the first screen object, and directly to the first screen object;

(f) receiving the user's selections of commands to assign to soft key objects in the first screen object, programmable key objects in the first screen object, and directly to the first screen object.

2. The remote control development program embodied on a computer readable medium of claim 1, the remote control development program further comprising instructions for causing the general purpose computer to:

download the first screen object to a programmable remote control unit that is communicatively connected to the general purpose computer.

3. The remote control development program of claim 1, additionally comprising, the instructions further configured to cause a general purpose computer to provide a user with the ability to transfer the first screen object to programmable remote control unit.

4. The remote control development program of claim 3, wherein the instructions further configured to cause a general purpose computer to provide a user with the ability to transfer the first screen object to programmable remote control unit via a docking station that couples to the programmable remote control unit.

5. The remote control development program of claim 3, wherein each soft key comprises a representation of a soft key that will be displayed on the programmable remote control unit.

6. The remote control development program of claim 1, wherein the instructions are configured to cause the general purpose computer to access one or more preconfigured screen objects.

7. The remote control development program of claim 6, wherein the preconfigured screen objects are stored in a database of the general purpose computer.

8. The remote control development program of claim 1, wherein the instructions further cause a computer to facilitate editing of the first screen object by allowing the user to edit the tagnames for commands that are assigned to the soft key objects.

9. A method of editing one or more screen objects for downloading to a programmable remote control unit using a general purpose computer, the general purpose computer comprising a processor, an operating system, a short term memory, a long term memory, a graphics display and a user input device, the screen objects each comprising a screen layout definition and at least one key object which is a soft key object or a programmable key object, the screen object providing for a screen display and commands associated therewith, wherein each soft key object comprises a representation of a soft key, a text label for the representation, a location for displaying the [graphic] *soft key object*, and a tagname for a command which is to be issued when the soft key is pressed, each programmable key object comprises an identifier of one of plural programmable keys of a programmable remote control unit and a tagname for a command which is to be issued when the identified programmable key is pressed, each command comprises a message which, when received by a given multimedia processing unit, causes the multimedia processing unit to alter a defined setting of the multimedia processing unit in a predictable manner;

the method comprising:

(a) the general purpose computer displaying a representation of the appearance of the first screen object;

(b) the general purpose computer simultaneously displaying information regarding the first screen object and the key objects of the first screen object;

(c) the general purpose computer providing [objected] *object* oriented tools for creating and editing soft key objects;

(d) the general purpose computer providing objected [oriented] *orient* tools for creating and editing labels;

(e) the general purpose computer displaying tagnames for commands which may be assigned to soft key objects in the first screen object, programmable key objects in the first screen object, and directly to the first screen object;

(f) the general purpose computer receiving the user's selections of commands to assign to soft key objects in the first screen object, programmable key objects in the first screen object, and directly to the first screen object.

10. The method of claim 9, additionally comprising the general purpose computer downloading the screen object to the programmable remote control unit.

11. The method of claim 9, additionally comprising the general purpose computer accessing the first screen object from one or more preconfigured screen objects from a database.

12. The method of claim 10, wherein the general purpose computer downloads the first screen object to the programmable remote control unit via a docking station that communicatively couples to the programmable remote control unit.

*13. A remote control development program for use in connection with a general purpose computer comprising a processor, an operating system, a short term memory, a long term memory, a graphics display and a user input device, the remote control development program comprising:*

*a set of instructions on a computer-readable medium, the instructions configured to cause the general purpose computer to provide a user with the ability to edit a screen object comprising a screen layout definition and at least one key object which is a soft key object, the screen object providing for a screen display and commands associated therewith wherein each soft key object comprises a representation of a soft key, a location for displaying the representation of the soft key, and a tagname for a command which is to be issued when the soft key is activated, the command comprising a message which, when received by a given multimedia processing unit, causes the multimedia processing unit to alter a defined setting of the multimedia processing unit in a predictable manner; and wherein the instructions are further configured to cause the general purpose computer to:*

(a) *display a representation of the appearance of the screen object;*

(b) *display information regarding the screen object and the key objects of the screen object;*

(c) *accept user input via object oriented tools for creating and editing soft key objects;*

(d) *display tagnames for commands which may be assigned to soft key objects in the screen object; and*

(e) *accept user selections of commands to assign to soft key objects in the screen object.*

*14. The remote control development program of claim 13, wherein the at least one key object further comprises a programmable key object, the programmable key object comprising an identifier of one of plural programmable keys of a programmable remote control unit and a tagname for a command which is to be issued when the identified programmable key is activated and wherein the instructions are further configured to cause the general purpose computer to display tagnames for commands which may be assigned to programmable key objects in the screen object and accept user selections of commands to assign to programmable key objects in the screen object.*

*15. The remote control development program of claim 13, wherein the instructions are further configured to cause the general purpose computer to simultaneously display information regarding the screen object and the key objects of the screen object.*

*16. The remote control development program of claim 13, wherein the instructions are further configured to cause the general purpose computer to download the screen object to a programmable remote control unit that is communicatively connected to the general purpose computer.*

*17. The remote control development program of claim 13, wherein the instructions are further configured to cause the general purpose computer to provide a user with the ability to transfer the screen object to a programmable remote control unit.*

*18. The remote control development program of claim 17, wherein the instructions are further configured to cause the general purpose computer to provide a user with the ability to transfer the screen object to the programmable remote control unit via a docking station that couples to the programmable remote control unit.*

*19. The remote control development program of claim 17, wherein each soft key comprises a representation of a soft key that will be displayed on the programmable remote control unit.*

*20. The remote control development program of claim 13, wherein the instructions are further configured to cause the general purpose computer to access one or more preconfigured screen objects.*

*21. The remote control development program of claim 20, wherein the preconfigured screen objects are stored in a database of the general purpose computer.*

*22. The remote control development program of claim 13, wherein the instructions are further configured to cause the general purpose computer to facilitate editing of the screen object by allowing the user to edit the tagnames for commands that are assigned to the soft key objects.*

*23. A method of editing one or more screen objects for downloading to a programmable remote control unit using a general purpose computer, the general purpose computer comprising a processor, an operating system, a short term memory, a long term memory, a graphics display and a user input device, the screen objects each comprising a screen layout definition and at least one key object which is a soft key object, the screen object providing for a screen display and commands associated therewith, wherein each soft key object comprises a representation of a soft key, a location for displaying the representation of the soft key, and a tagname for a command which is to be issued when the soft key is activated, the command comprising a message which, when received by a given multimedia processing unit, causes the multimedia processing unit to alter a defined setting of the multimedia processing unit in a predictable manner, the method comprising:*

(a) *the general purpose computer displaying a representatoin of the appearance of the screen object;*

(b) *the general purpose computer displaying information regarding the screen object and the key objects of the screen object;*

(c) *the general purpose computer receiving user input via object oriented tools for creating and editing soft key objects;*

(d) *the general purpose computer displaying tagnames for commands which may be assigned to soft key objects in the screen object; and*

(e) *the general purpose computer receiving user selections of commands to assign to soft key objects in the screen object.*

*24. The method of claim 23, wherein the at least one key object further comprises a programmable key object, the programmable key object comprising an identifier of one of plural programmable keys of the programmable remote control unit and a tagname for a command which is to be issued when the identified programmable key is activated and wherein the method additionally comprises the general purpose computer displaying tagnames for commands which may be assigned to programmable key objects in the screen object and the general purpose computer receiving user selections of commands to assign to programmable key objects in the screen object.*

*25. The method of claim 23, additionally comprising the general purpose computer simultaneously displaying information regarding the screen object and the key objects of the screen object.*

*26. The method of claim 23, additionally comprising the general purpose computer downloading the screen object to the programmable remote control unit.*

*27. The method of claim 26, wherein the general purpose computer downloads the screen object to the programmable remote control unit via a docking station that communicatively couples to the programmable remote control unit.*

*28. The method of claim 27, additionally comprising the general purpose computer accepting user input via object oriented tools for creating and editing a label to be displayed with the screen object.*

*29. The method of claim 28, wherein the label is associated with a soft key object of the screen object.*

*30. The method of claim 23, additionally comprising the general purpose computer accessing the screen object from one or more preconfigured screen objects from a database.*

* * * * *